United States Patent
Grunwald

(10) Patent No.: US 6,955,586 B2
(45) Date of Patent: Oct. 18, 2005

(54) CMP COMPOSITION AND PROCESS

(75) Inventor: John Grunwald, Ramat-Gan (IL)

(73) Assignee: J. G. Systems, Inc., Miami, FL (US)

( * ) Notice: Subject to any disclaimer, the term of this patent is extended or adjusted under 35 U.S.C. 154(b) by 49 days.

(21) Appl. No.: 10/678,880

(22) Filed: Oct. 3, 2003

(65) Prior Publication Data

US 2004/0214512 A1    Oct. 28, 2004

(30) Foreign Application Priority Data

Apr. 24, 2003 (IL) .................................... 155554

(51) Int. Cl.⁷ ................................................ B24B 1/00

(52) U.S. Cl. .................... 451/36; 438/692; 438/693; 216/89; 216/96; 216/105; 51/307; 51/308; 51/309; 106/3

(58) Field of Search ................ 51/307, 308, 309; 106/3; 451/36, 37; 438/692, 693; 216/89, 216/96, 105

(56) References Cited

U.S. PATENT DOCUMENTS

| | | | | |
|---|---|---|---|---|
| 5,334,281 A | * | 8/1994 | Doerre et al. | ................ 438/404 |
| 6,074,287 A | * | 6/2000 | Miyaji et al. | ................ 451/287 |
| 6,117,780 A | * | 9/2000 | Tsai et al. | .................... 438/692 |
| 6,448,182 B1 | | 9/2002 | Hall et al. | |
| 6,720,264 B2 | * | 4/2004 | Sahota et al. | ................ 438/692 |
| 2002/0177316 A1 | | 11/2002 | Miller et al. | |

FOREIGN PATENT DOCUMENTS

| WO | WO 01/44396 | 6/2001 |
|---|---|---|
| WO | WO 02/083804 | 10/2002 |

* cited by examiner

*Primary Examiner*—Michael Marcheschi
(74) *Attorney, Agent, or Firm*—Carmody & Torrance LLP

(57) ABSTRACT

The present invention provides a chemical metal polishing (CMP) method with improved flexibility and improved processing window, especially as it relates to the chemical aspect of CMP technology. Broadly speaking, the invention has two aspects: according to one aspect, the invention provides a new CMP composition, comprising as an oxidizer, at least one of inorganic halogen derivative and dissolved oxygen while in a second aspect the invention provides an improved method for polishing metals.

3 Claims, No Drawings

CMP COMPOSITION AND PROCESS

FIELD OF INVENTION

The invention relates to wafer planarizing process and compositions, known in the industry as CMP, for chemical mechanical polishing.

BACKGROUND OF THE INVENTION

With the growing demand for ever greater miniaturization of ULSI devices, planarization via CMP becomes an increasingly critical aspect in the fabrication sequence of semiconductor devices. The challenge stems from the multitude and differing nature of materials used in the various layers, the demanding geometries and aspect ratios of the structures, the ever present quest for improved yields via reduction of defects, etc.

Patent applications WO 02/083804 to Costas, US 2002/0177316 A1 to Miller and WO 01/44396 A1 to Sachan, are referenced herewith as indicative of methods and compositions of typical CMPs of the prior art. They reflect the differing natures of CMP compositions, dictated by the tasks/problems they need to address, for example nature of the layers, selectivity, surface roughness and throughput.

CMP slurries can be somewhat simplistically described as consisting of abrasive particulate matter suspended in aq, desirably stable compositions. Such suspensions can contain a host of additives, pH adjusters, leveling agents, oxidants, emulsifiers where needed, and the like. In CMP, the slurry is usually dispensed on a rotating pad in contact with a rotating wafer. Planarization involves a combination of abrasion and chemical reaction at the wafer/slurry interface.

A significant, and generally central component of various metal-polishing slurries, is the oxidizing agent, with hydrogen peroxide and inorganic nitrates appear prevalent. Generally, the oxidizing agent is tailored to suit a given metal to be polished, with copper perhaps being the most challenging. Copper is becoming the metal of choice for interconnect applications, due to its superior electrical conductivity.

While hydrogen peroxide is an attractive oxidizing agent because of reasonable cost, it is not without some serious drawbacks namely poor stability, especially in the presence of transition metals that are known to catalyze decomposition. Another shortcoming of $H_2O_2$ is it's less than ideal selectivity. Further, the reaction of peroxides during dissolution of copper, is highly exothermic, making it problematic to maintain temperature stability at the copper/slurry interface, where polishing takes place.

U.S. Pat. No. 6,448,182 to Hall addresses the stability issue through incorporation of stabilizers that are said to reduce, but will not eliminate, decomposition.

The prior art proposes the use of corrosion inhibitors, typically benzotriazoles, as a way to minimize copper oxidation, and improve selectivity. Indeed, benzotriazole is extensively used in the prior art in connection with a host of processes involving copper, taking advantage of its somewhat specific protective, film-forming properties with copper metal, thus serving as a corrosion/oxidation inhibitor for Cu. Its benefit, if any, for metals other than copper, is not indicated.

Some CMP compositions of the prior art are also based on inorganic nitrates. Inorganic nitrates tend to be too aggressive and corrosive, and will not generally favor selectivity, especially for copper The industry is therefore in constant pursuit of better, task-oriented chemical polishing compositions and methods to satisfy ever-increasing demands for better yields, as geometries continue to shrink.

Mechanistically, CMP is believed to be accomplished by a dual, said to be synergistic, mechanical-chemical process. The mechanical aspect is obtained by applying downward pressure, via a slurry-covered pad, on the surface of the device to be planarized, with the abrasive in the slurry removing unwanted surface material. As such, the mechanism of the abrasive/mechanical action is relatively simple and fairly well understood. On the other hand, the chemical aspect of CMP is more complex, and its interaction with the mechanical aspect of CMP has yet to be fully elucidated. Indeed, it is not quite clear how and to what extent, the oxidizing chemistry of CMP compositions participates in, and brings about, the desired final surface finish, namely smoothness, specularity, freedom from oxides, scratches, and the like. This mechanistic uncertainty especially holds for the planarizing of metals, in particular copper, as partly reflected in above-referenced patents. Indeed, the recent prior art is attempting to address this issue of optimal planarization of copper, in searching for oxidants/chemical etchants that assist and complement polishing/leveling, beyond what is achieve mechanically, albeit concurrently with mechanical abrasion. However, in applying simultaneously/concurrently both chemical and mechanical action of the slurry, the prior art imposes constraints on, and does not fully exploit, chemical polishing, because metal chemical polishing, as opposed to mechanical abrasion, may require different optimal contact times, different process times, etc, depending on the nature and state of the surface to be polished/planarized. Indeed, mechanical abrasion/polishing may, by its very mechanical nature, inherently bring about micro scratches, at the same time as the chemical polishing is trying to "heal" such scratches. Such undertaking is potentially mutually contradictory, if chemical/mechanical polishing is attempted simultaneously.

SUMMARY OF THE INVENTION

The central objective of the invention is to provide a chemical metal polishing (CMP) method with improved flexibility and improved processing window, especially as it relates to the chemical aspect of CMP technology. Broadly speaking, the invention has two aspects: according to one aspect, the invention provides a new CMP composition, while in a second aspect the invention provides an improved method for polishing metals.

In addressing the latter, process-based aspect, the invention recognizes that a lot can be gained by allowing the layer or layers to be planarized, to be chemically polished, without at the same time, necessarily undergoing mechanical abrasion. Following are some approaches whereby this can be accomplished. Other approaches will emerge, as one skilled in the art will practice the concept of the invention, namely the "de-coupling" of chemical polishing from its mechanical counter part, allowing it to be optimized as a stand alone component of CMP.

Thus, the following approaches may be carried out in order to perform chemical polishing separately from mechanical abrasion:

Discontinue exerting, intermittently and for a given short period of time, downward pressure on the rotating slurry-covered pad, while continuing to dispense the same CMP slurry, with its chemical polishing ingredients.

Dispense, deliver a chemical polishing composition, for a short period of time as needed, with no abrasive particles in it, while continue rotating the pad.

Dispense intermittently via the rotating pad, a CMP slurry with an abrasive that is designed for minimal, if any, removal of matter, or abrasion, allowing maximization of chemical polishing, without occasioning new scratches/microscratche. The rotating pad is thus acting as buffing device.

Dispense intermittently the chemical polishing composition onto the surface to be planarized, directly, and without it being imparted spinning or rotation, and also without said surface being in contact with the pad, allowing the chemical polishing composition to stay on the surface to be planarized for a given, as needed, period of time, before resuming rotation/spinning and/or before resuming abrasion, in the case further, additional abrasion is called for. Such technique has been advantageously used in microlythographic development/imaging, and it simulates/emulates immersion operation via an impromptu, improvised "bath", constituted by the "puddle". This approach, in a way, affords the well-known, and often attractive, chemical or electrochemical polishing/leveling, without disrupting the CMP production process, as currently practiced with wafers to be planarized. The patent thus teaches a combination of CMP with "purely" chemical polishing, offering improved flexibility.

Tat the risk of being redundant, the patent envisions above, or other methods, that afford optimal chemical polishing, without at the same time effecting mechanical abrasion of the surface to be polished or planarized, intermittently reducing or halting altogether, mechanical abrasion to principally or exclusively focus on chemical polishing, then resuming mechanical chemical polishing, if/as needed.

Again, while the patent envisions intermittent, potentially repeated interruptions of mechanical abrasion/polishing described above, it contemplates at lest one such interruption of mechanical abrasion/polishing, and exposure of the surface solely to chemical polishing, before CMP operation is completed.

Also, above or analogous steps, can timed to last fraction of seconds, or seconds, as needed for optimal chemical polishing, elimination of micro scratches, etc., with throughput, efficiency, practicability, being the guiding considerations.

Referring now to its compositional aspect, the invention provides a chemical metal polishing (CMP) composition comprising as an oxidizer, at least one of inorganic halogen derivatives and dissolved oxygen. In a preferred embodiment, the halogen derivatives are chlorine derivatives and the composition is characterized by an alkaline environment. As to dissolved oxygen, its concentration in the CMP composition may be raised by continuous bubbling of air, oxygen or ozone through the composition.

The composition of the invention may be used for polishing various metals, inter alia copper metal. In such case the CMP composition of the invention further comprises a complexing agent such as for example organic hydroxy acids, ammonia and EDTA.

Referring again to the process-based aspect, the invention provides a method for processing a surface of a structure, comprising delivering a fluid/liquid CMP composition onto said structure and applying CMP process to said structure while periodically interrupting said CMP process, thereby enabling maximization of chemical polishing of said surface by said composition. The structure is preferably made of a conducting or semiconducting material and the entire process imparts to said structure a planarized surface.

The CMP process mentioned above, comprises mechanically abrading and removing at least a portion of the surface of a structure by generally bringing a pad into contact with said surface and moving the pad in relation to the structure. Preferably, the pad is moved in a circular manner.

DETAILED DESCRIPTION OF THE INVENTION

As mentioned earlier, one aspect of the invention proposes CMP compositions comprising oxidizing compounds selected from the group of halogen, e.g. chlorine, derivatives and oxygen.

While oxygen (also at times referred to in the chemical literature as dissolved oxygen), is ever present in CMP compositions and liquid compositions in general, that are exposed to air, the invention envisions increasing the oxygen concentration/content of CMP compositions, by at least intermittently bubbling air/oxygen through the CMP composition.

Referring to chlorine derivatives, the invention envisions chlorine compounds wherein the oxidation state of Cl is above +1, i.e. $ClO^-$, $ClO_2^-$, etc. CMP compositions comprising above cited chlorine derivatives, will by necessity be alkaline, because of safety considerations. Indeed, in acid environments, chlorine derivatives are known to release dangerous, toxic fumes.

Above mentioned and other chlorine derivatives can be generated in-situ, following prior art practice, namely by bubbling chlorine—while taking extreme safety precautions—through the alkaline CMP composition, or by accessing available oxidizing chlorine derivatives offered by vendors.

CMP compositions comprising chlorine derivatives of this invention will contain complexing agents tailored to accommodate/solubilize in alkaline media, metal ions generated by a given polishing action. In the case of copper, compexation can be achieved by ammonia, EDTA, organic hydroxy acids, and the like.

It is further noted, that while chlorine-based oxidants are limited—due to safety considerations as noted above—to alkaline polishing compositions in general, and CMP compositions in particular, other halogens, namely bromine and iodine can embody compositions that are both acid and alkaline and they are within the scope of the invention.

As to concentrations, halogens and their derivatives can be of the order of at least several ppms if used in presence of other oxidants, or generally at least 1 g/l when acting as sole oxidants of the composition.

Referring again to oxygen, it is recognized that CMP slurries exposed to air, will inherently contain oxygen/dissolved oxygen. This patent strives to maximize oxygen levels/concentration in the slurry at all times of the process, beyond oxygen levels that would normally be present, via continuous bubbling of air, oxygen, or ozone, through the CMP slurry. Indeed, the concentration of oxygen/dissolved oxygen is mainly enhanced by increased partial pressure in the slurry, and low temperature of the slurry. It is noted that in this application the terms oxygen, dissolved oxygen will be used interchangeably, expressing total oxygen content or concentration of the composition.

It is also realized that in many CMP applications, even maximum obtainable oxygen/dissolved oxygen as sole oxidant, may not suffice to achieve a desired chemical polishing effect, thus requiring additional oxidizing compound or compounds. In such instances, the dissolved oxygen may act as an auxiliary oxidation booster, assisting also in the reoxidation of some type of oxidizing compounds in the slurry as they undergo chemical reduction and become depleted, as may be the case with CMP compositions disclosed in pending IL 154782 and 154783, referenced herewith, or other CMP compositions of the prior art.

The invention has described oxidant-related compositions, and also embodies improved processes. Regarding the latter, the invention discovers/recognizes that optimal synergism of the dual mechanical/chemical planarization can possibly be accomplished best, if one departs from the practice of concurrently and simultaneously endeavoring to achieve both mechanical abrasion of the surface to be polished, and at the very same time exposing the surface to be polished, (in the same, sole/single operation), to the chemical polishing reaction of the oxidizing components in the composition.

The invention thus teaches that mechanical abrasion and chemical polishing, while practiced with the same apparatus, leading to same finished product, within the same sequence of production operations, can better accomplish overall optimal polishing benefits, if chemical polishing and mechanical abrasion are addressed intermittently and as needed, separately from one-another, and not as a twinned operation.

What is claimed is:

1. A process for chemical mechanical polishing of a surface, said process comprising:
   a. subjecting said surface to mechanical abrasion; and
   b. delivering a chemical polishing slurry to said surface;
      wherein the step of subjecting said surface to mechanical abrasion is intermittently stopped but the delivery of a chemical polishing slurry to said surface is continuous.

2. A process according to claim 1 wherein the mechanical abrasion comprises rotating a polishing pad in contact with said surface.

3. A process according to claim 1 wherein the surface comprises a semiconducting layer.

* * * * *